United States Patent
Lee et al.

(10) Patent No.: US 6,490,199 B2
(45) Date of Patent: Dec. 3, 2002

(54) SENSE AMPLIFIER CIRCUIT FOR A FLASH MEMORY DEVICE

(75) Inventors: Byeong-Hoon Lee, Seoul (KR); Young-Ho Lim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/867,899

(22) Filed: May 30, 2001

(65) Prior Publication Data

US 2002/0105831 A1 Aug. 8, 2002

(30) Foreign Application Priority Data

Feb. 2, 2001 (KR) ............................................. 001-5146

(51) Int. Cl.[7] .............................................. G11C 16/06
(52) U.S. Cl. ............................ 365/185.21; 365/185.18; 365/203
(58) Field of Search ........................ 365/185.21, 185.18, 365/185.25, 185.33, 189.09, 196, 210, 203

(56) References Cited

U.S. PATENT DOCUMENTS

| | | | | |
|---|---|---|---|---|
| 5,237,534 A | * | 8/1993 | Tanaka et al. | 365/185.21 |
| 6,052,307 A | * | 4/2000 | Huber et al. | 327/52 |
| 6,141,277 A | * | 10/2000 | Tanzawa | 365/189.04 |
| 6,181,599 B1 | * | 1/2001 | Gongwer | 365/185.18 |

* cited by examiner

Primary Examiner—Hoai Ho
Assistant Examiner—Thong Le
(74) Attorney, Agent, or Firm—F. Chau & Associates, LLP

(57) ABSTRACT

A sense amplifier circuit for a flash memory device of the present invention includes first and second pre-charge circuits for pre-charging a data line (or bit line connected electrically to the data line). The first and second pre-charge circuits are each connected to the data line. The first pre-charge circuit provides a current changed by a fluctuation of the data line voltage to the data line, and the second pre-charge circuit provides a constant voltage regardless of the fluctuation of the data line voltage to the data line. The sense amplifier minimizes the time required to pre-charge the data line (or bit line) to a desired voltage.

20 Claims, 8 Drawing Sheets

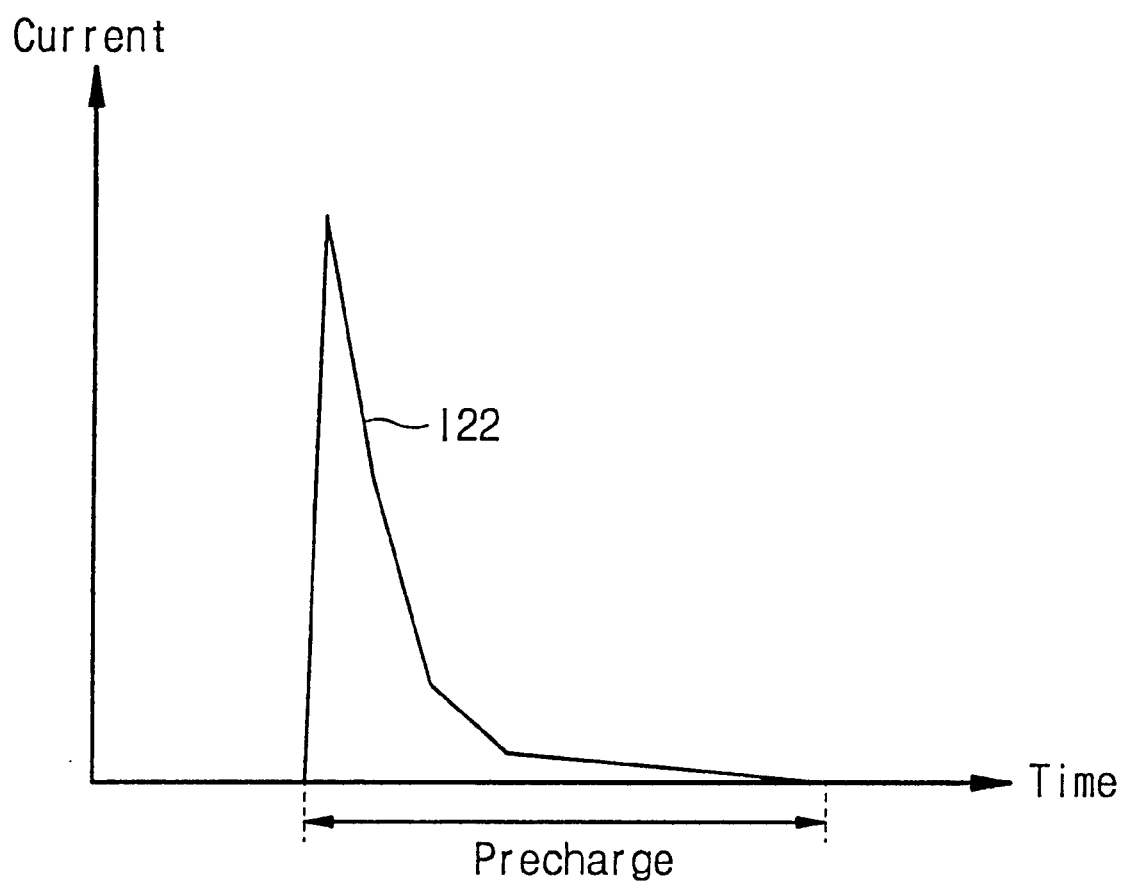

SENSE AMPLIFIER CIRCUIT FOR A FLASH MEMORY DEVICE

BACKGROUND

1. Technical Field

The present invention relates generally to semiconductor memory devices and, in particular, to a sense amplifier circuit for a flash memory device, the sense amplifier for detecting states of a memory cell.

2. Background Description

Nonvolatile flash memory devices have been widely used. An electrically erasable and electrically programmable memory cell of a flash memory device is formed of a floating gate transistor. The floating gate transistor has N-type source and drain regions, a floating gate, and a control gate. The N-type source and drain regions are formed on a P-type semiconductor substrate (or bulk). The floating gate is formed on a thin insulation film (or tunnel oxide film) on a channel region between the source and drain regions, and has a thickness less than 100 Å. The control gate is used as a word line formed on the floating gate. The memory cell is programmed by hot electron injection, which is well known in the art. When the memory cell is programmed, it is in a non-conducting state. The programmed memory cell is erased by an F-N tunneling method, which is also well known in the art. When the memory cell is erased, it is in a conducting state.

A sense amplifier circuit is used to detect whether a memory cell is in a conducting or non-conducting stage. FIG. 5 is a diagram illustrating a conventional sense amplifier. As shown, the conventional sense amplifier circuit is of a single-ended type. The sense amplifier circuit is electrically connected to a bit line BL through NMOS transistors 10 and 12, which compose a decoding circuit that couples the bit line BL to a data line DL. An electrically erasable and programmable memory cell MC is connected to the bit line BL.

The sense amplifier circuit is constructed of three PMOS transistors 14, 16, and 18, three NMOS transistors 20, 22, and 24, and three inverters 26, 28, and 30. Current paths of the PMOS transistors 14 and 16 are formed in series between a power supply voltage Vcc (utilized as a first supply voltage) and sense node SO. A control signal Vload is applied to a gate of the PMOS transistor 14. A gate of the PMOS transistor 16 is connected to the sense node SO. The NMOS transistor 20 has a current path formed between the sense node SO and the data line DL. Current paths of the PMOS transistor 18 and NMOS transistor 22 are formed in series between the power supply voltage Vcc and the data line DL. A control signal Vpre is applied to a gate of the PMOS transistor 18. Gates of the NMOS transistors 20 and 22 are controlled by an output voltage BIAS of the inverter 26 connected to the data line DL. A voltage of the sense node SO is generated as a sense data nSAOUT through the inverters 28 and 30. The NMOS transistor 24 is connected between the data line DL and a ground voltage GND (utilized as a second supply voltage), and is switched by a control signal Vdis.

In the operation of the sense amplifier circuit, an address is changed so as to select a memory cell(s), and then row address decoding signals YA and YB are activated to the high level, thus turning on the NMOS transistors 10 and 12 that compose the decoding circuit. The bit line BL and the data line DL are electrically connected through the NMOS transistors 10 and 12, when the NMOS transistors 10 and 12 are turned on.

FIG. 6 is a timing diagram illustrating an operation of the sense amplifier circuit of FIG. 5. Referring to FIG. 6, before the bit line BL and the data line DL are electrically connected with each other, a voltage of the data line DL is discharged. Namely, the control signal Vdis for discharging the data line DL voltage is activated to high during a predetermined time. During an activation period of the Vdis, the data line DL voltage is initialized by the NMOS transistor 24, e.g., to lower than 0.5 V.

After discharging, the control signal Vpre is activated from a high level to a low level, resulting in a current flowing from the power supply voltage Vcc to the data line DL through the PMOS transistor 18 and the NMOS transistor 22. Then, the data line DL voltage increases. As shown in FIG. 6, the current flows to the data line DL through the PMOS transistor 18 and the NMOS transistor 22 and, simultaneously, a current flows to the data line DL through the PMOS transistors 14, 16, and the NMOS transistor 20. This is because the control signal Vload is activated to the low level after the control signal Vpre is activated. As the data line DL voltage gradually increases to the high level, the output voltage BIAS from the inverter 26 starts to attenuate in proportion to the increase of the data line DL voltage. The current provided to the data line DL through NMOS transistors 20 and 22 is decreased by the attenuation of the output voltage BIAS from the inverter 26. The data line DL voltage is charged to a predetermined voltage level, e.g., 0.8 V. The control signal Vpre applied to the gate of the PMOS transistor 18 is inactivated to the high level. The control signal Vload is activated to the low level after the control signal Vpre is activated during a predetermined time period. However, the control signal Vload can be designed to be activated to the low level at the same time the control signal Vpre is activated.

Subsequently, when a voltage of the word line WL increases, the voltage of the data line DL is increased or decreased based upon the state of the memory cell, that is, whether the memory cell is in a conducting or non-conducting state. A current that flows through a memory cell in the conducting state is typically designed to be larger than a current that flows through the transistors 14 and 20. Under these conditions, if the memory cell is in the conducting state, then the voltage of the sense node SO is attenuated by the data line DL voltage to be lower than that of a pre-charged voltage. The attenuated voltage of the sense node SO is converted into a digital signal (or is detected) by the inverter 28. In contrast, if the memory cell is in a non-conducting state, then the current does not flow through the memory cell. The current flows to the data line DL and the sense node SO through the load transistor 14, and then the sense node SO voltage is increased. The increased sense node SO voltage is converted into a digital signal (or is detected) by the inverter 28.

However, the conventional sense amplifier circuit has a problem as described below. In a latter part of the pre-charge period, the output voltage BIAS from the inverter 26 (i.e., a gate voltage of the NMOS transistor 22) is attenuated by the increased voltage of the data line DL. FIG. 7 is a graph illustrating pre-charge characteristics in accordance with the prior art. As shown, a difference between the source voltage (or data line voltage) of the NMOS transistor 22 and the gate voltage BIAS is reduced, whereby a current I22 provided through the NMOS transistor 22 is sharply attenuated in the latter part of the pre-charge period. Therefore, it typically takes more time to pre-charge the data line DL (or bit line connected to the data line electrically) to a desired voltage.

SUMMARY OF THE INVENTION

The problems stated above, as well as other related problems of the prior art, are solved by the present invention, a sense amplifier circuit that reduces a pre-charging time of a data line (or bit line) in a semiconductor memory device.

According to an aspect of the invention, in a flash memory circuit having a plurality of electrically erasable or programmable memory cells and a decoding circuit for electrically connecting a bit line corresponding to a selected memory cell to a data line, a sense amplifier circuit is provided for detecting an on/off state of the selected memory cell by sensing a voltage fluctuation of the bit line. The sense amplifier includes a bias circuit for generating a constant bias voltage during a pre-charge period. A first pre-charge circuit provides a variable current to the data line. The variable current changes with a voltage fluctuation of the data line. A second pre-charge circuit provides a constant current to the data line. The constant current is determined by the constant bias voltage, regardless of the voltage fluctuation of the data line. A detecting circuit connected to the data line senses the voltage fluctuation of the bit line during a sensing period, and generates data signals corresponding to the on/off state of the selected memory cell.

According to the sense amplifier circuit of the present invention, although the voltage of the data line increases during a pre-charge period, a constant current can flow to the data line regardless of the increase of the data line voltage.

These and other aspects, features and advantages of the present invention will become apparent from the following detailed description of preferred embodiments, which is to be read in connection with the accompanying drawings.

BRIEF DESCRIPTION OF THE DRAWINGS

FIG. 7 is a graph illustrating pre-charge characteristics in accordance with the prior art.

DETAILED DESCRIPTION OF PREFERRED EMBODIMENTS

Referring now to FIGS. 1 through 4, a preferred embodiment of the present invention will be described below.

Figure 1:
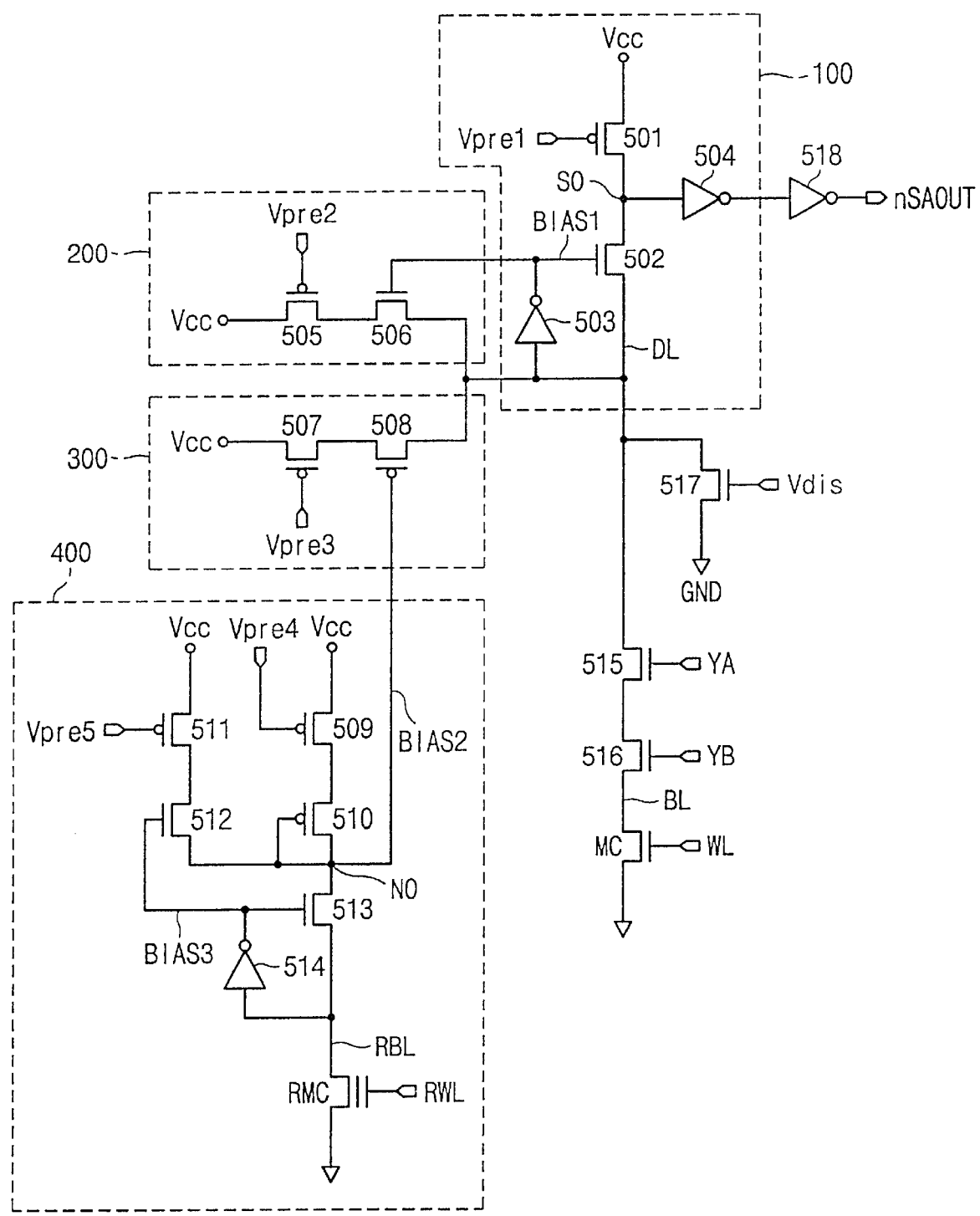
FIG. 1 is a circuit diagram illustrating a preferred embodiment of a sense amplifier circuit in accordance with the present invention.

FIG. 1 is a circuit diagram illustrating a preferred embodiment of a sense amplifier circuit in accordance with the present invention. The sense amplifier circuit of the present invention is designed as a single-ended sense amplifier circuit. In the sense amplifier circuit, a data line DL is connected electrically to a bit line BL through NMOS transistors 515 and 516. NMOS transistors 515 and 516 are connected to the data line DL and compose a decoding circuit. In this embodiment, although a memory cell corresponding to one bit line is illustrated for convenience, it should be understood that a number of memory cells arranged in a matrix of rows and columns is provided to the flash memory device. The memory cell is constructed of a floating gate transistor, and is electrically erased and programmed.

The sense amplifier circuit includes a detecting circuit 100, a first pre-charge circuit 200, a second pre-charge circuit 300, and a bias circuit 400. The detecting circuit 100 functions to electrically determine a high signal or low signal in response to a voltage level of a bit line BL, and includes a PMOS transistor 501 as a load transistor, a NMOS transistor 502 as an insulation transistor, and inverters 503 and 504. The PMOS transistor 501 has a gate connected so as to receive a first pre-charge control signal Vpre1. The PMOS transistor 501 is connected between a power supply voltage Vcc (utilized as a first supply voltage) and a sense node SO. The NMOS transistor 502 is connected between the sense node SO and a data line DL, and is controlled by an output voltage of the inverter 503, i.e., a bias voltage BIAS1. The inverter 503 connected to the data line DL functions to maintain the bias voltage BIAS1 at a gate of the NMOS transistor 502 to be a constant voltage level. The inverter 504 connected to the sense node SO electrically generates a high signal or low signal based upon a voltage level of the SO.

The first pre-charge circuit 200 is connected to the data line DL, and provides a current to the data line DL that changes based upon a voltage of the data line DL during a predetermined pre-charge period. The first pre-charge circuit 200 includes a PMOS transistor 505 and a NMOS transistor 506. These PMOS and NMOS transistors 505 and 506 are connected in series between the power supply voltage Vcc and the data line DL. The PMOS transistor 505 is controlled by a second pre-charge control signal Vpre2. The NMOS transistor 506 is controlled by the output voltage BIAS1 provided from the inverter 503.

The second pre-charge circuit 300 is connected to the data line DL, and provides a current to the data line DL that does not change-when the voltage of the data line DL fluctuates during the predetermined pre-charge period. In this embodiment, the second pre-charge circuit 300 includes PMOS transistors 507 and 508. The.PMOS transistors 507 and 508 are connected between the power supply voltage Vcc and the data line DL in series. The PMOS transistor 507 is controlled by a third pre-charge control signal Vpre3. The PMOS transistor 508 is controlled by a bias voltage BIAS2 provided from the bias circuit 400.

The bias circuit 400 includes PMOS transistors 509, 510, and 511, NMOS transistors 512 and 513, an inverter 514, and a reference memory cell RMC. The PMOS transistors 509 and 510 are connected in series between the power supply voltage Vcc and an output node NO generating the bias voltage. The PMOS transistor 509 is controlled by a fourth pre-charge control signal Vpre4. The PMOS transistor 510 is controlled by the output node NO, i.e., the bias voltage BIAS2. The PMOS and NMOS transistors 511 and 512 are connected between the power supply voltage Vcc and the output node NO in series. The NMOS transistor 513 is connected between the output node NO and a reference bit line RBL coupled to the reference memory cell RMC. The PMOS transistor 511 is controlled by a fifth pre-charge control signal Vpre5 and both NMOS transistors 512 and 513 are controlled by an output voltage BIAS3 from the inverter 514 coupled to the RBL.

The sense amplifier circuit according to the present invention includes a NMOS transistor 517 connected between the data line DL and a ground voltage GND (utilized as a second supply voltage). The NMOS transistor 517 is controlled by a control signal Vdis that is activated during a predetermined discharge period. The sense amplifier circuit also includes an inverter 518 for generating a signal detected by the detecting circuit 100.

Figure 4A:
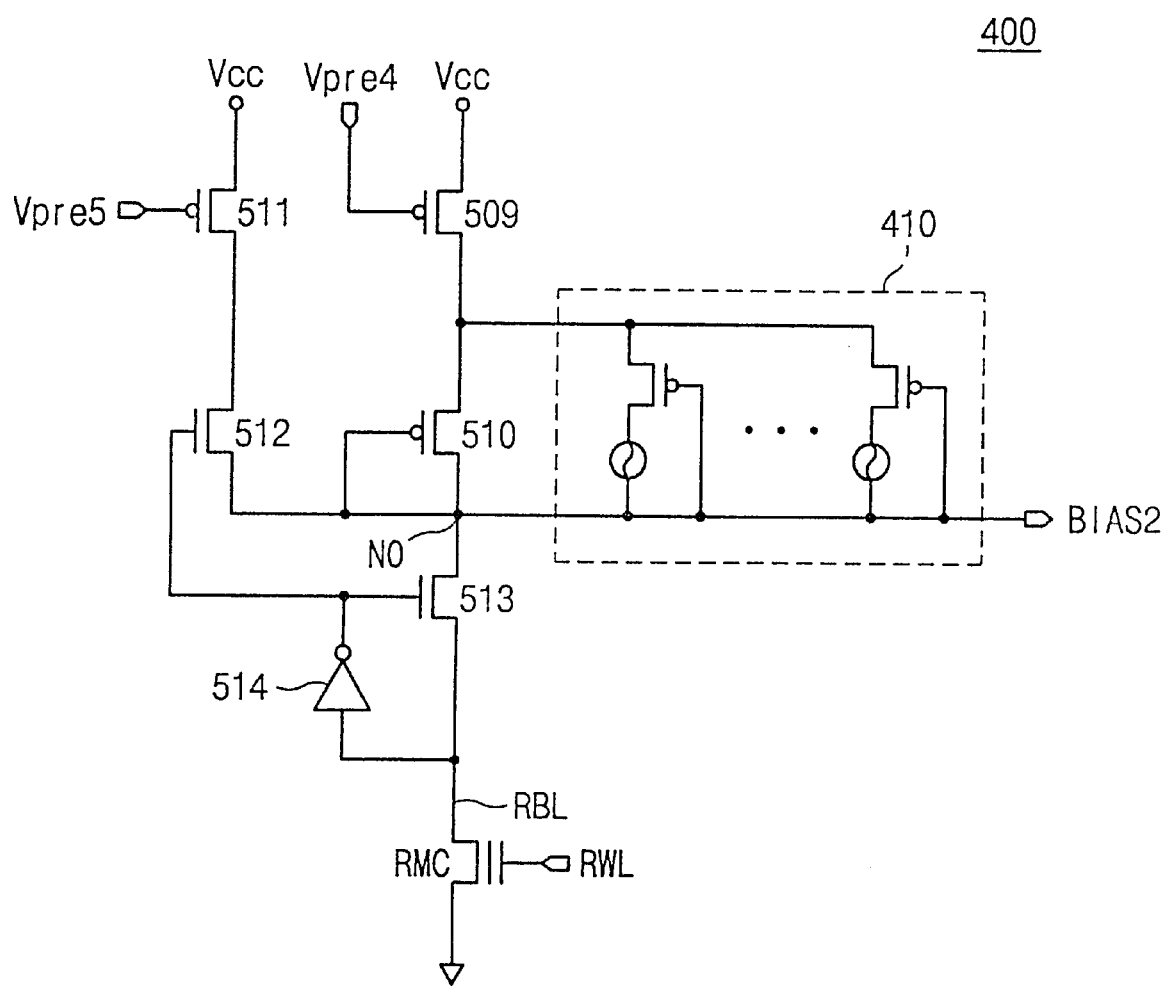
FIGS. 4A and 4B are circuit diagrams illustrating other embodiments of a bias circuit of FIG. 1.
Figure 4B:
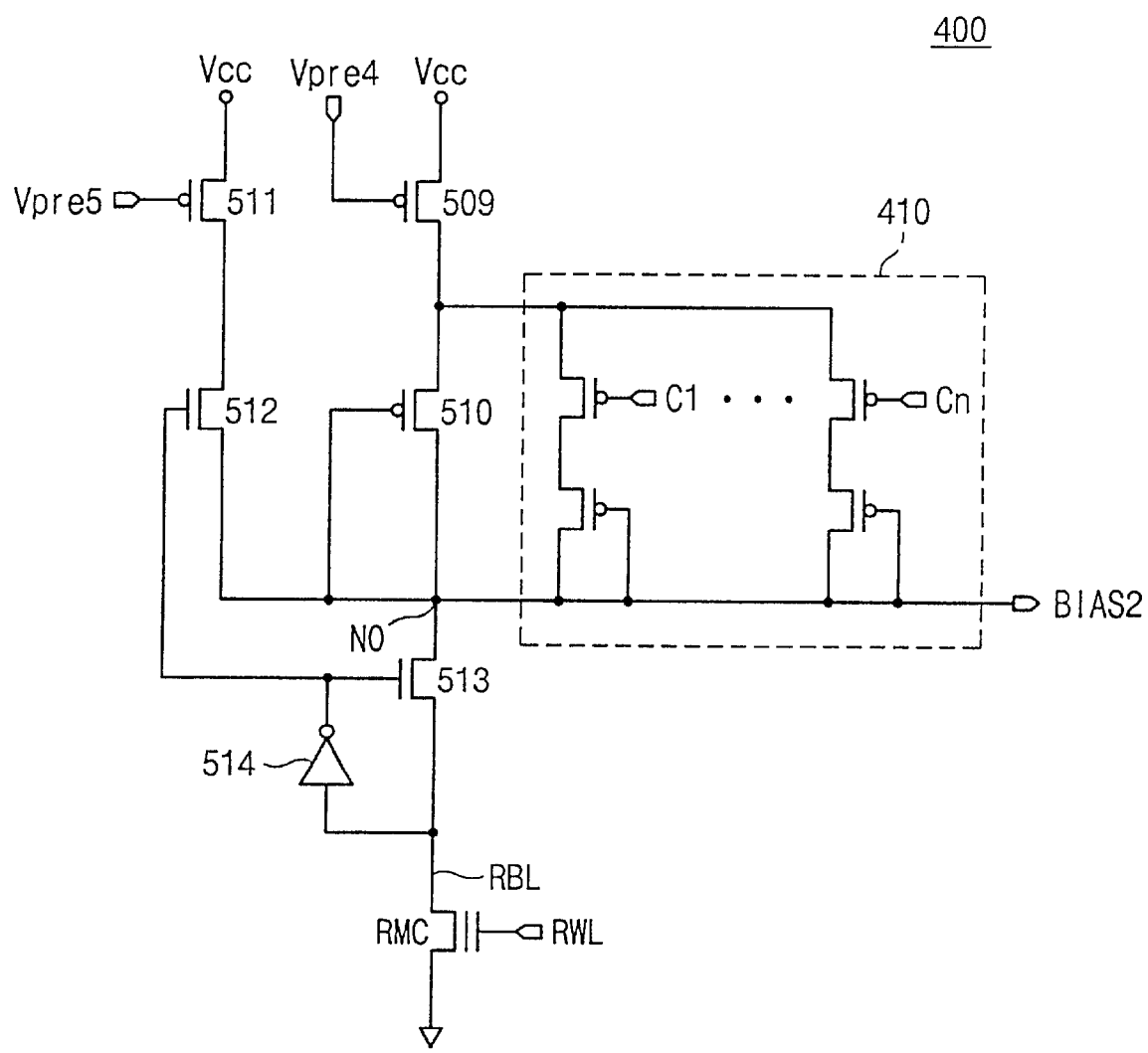
Figure 5:
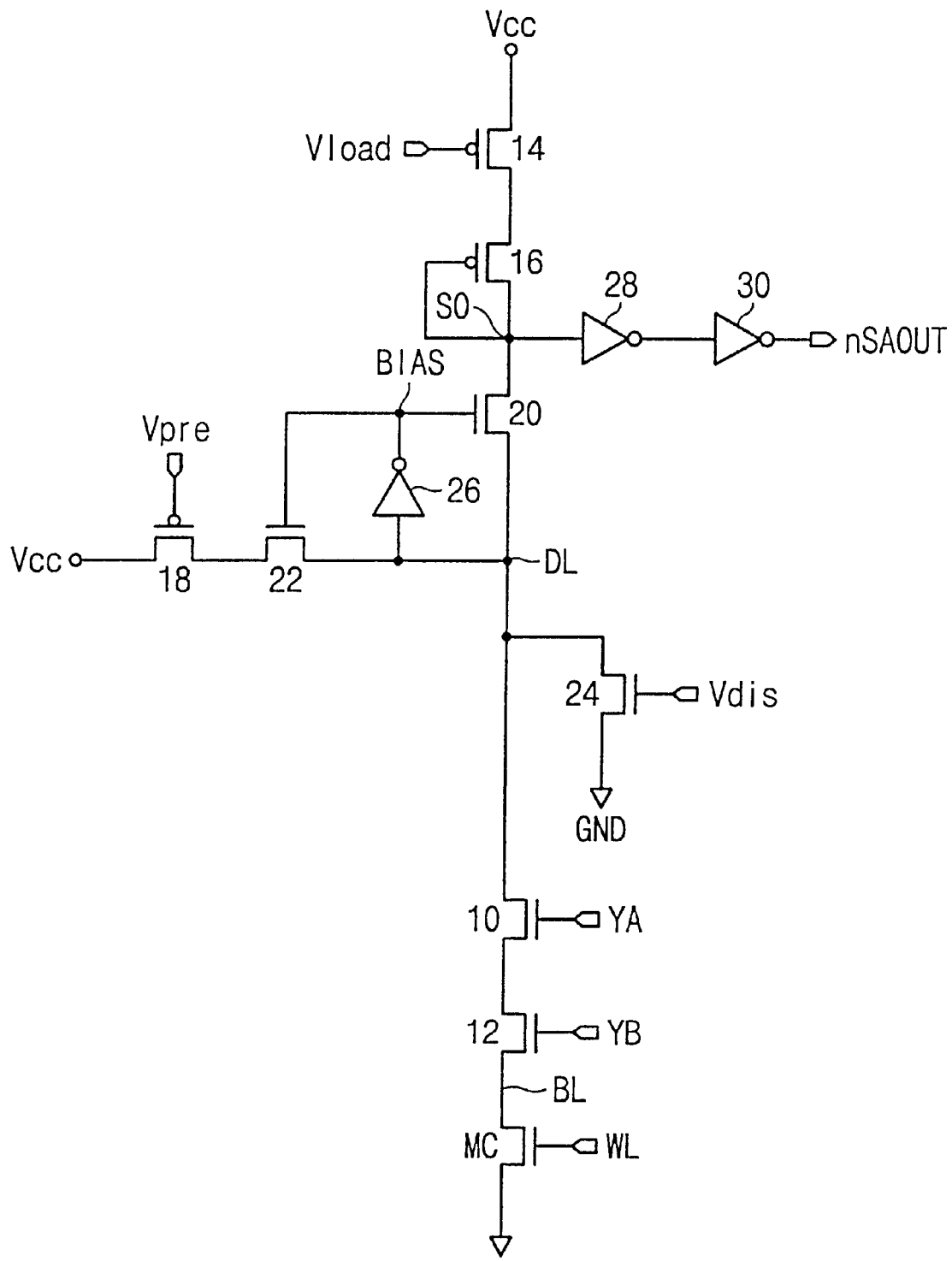
FIG. 5 is a circuit diagram illustrating a conventional sense amplifier circuit.
Figure 6:
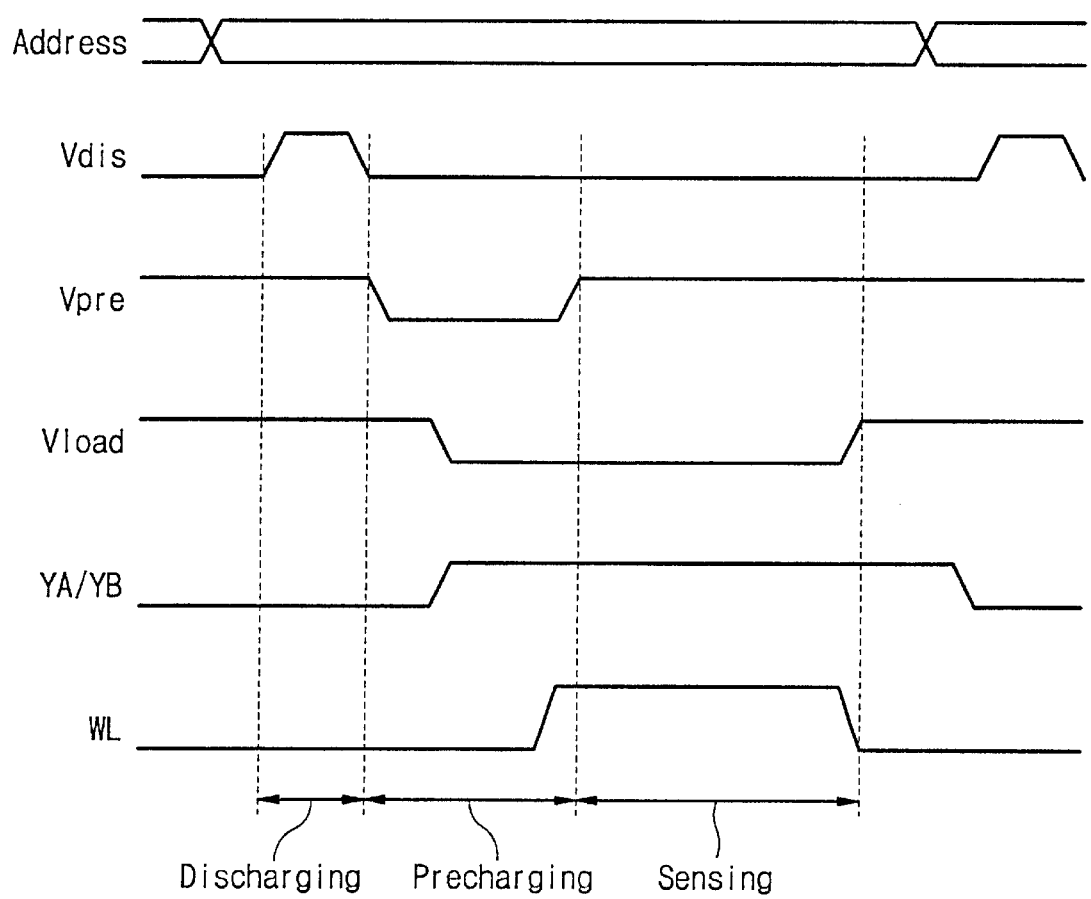
FIG. 6 is a timing diagram illustrating an operation of the sense amplifier circuit of FIG. 5.

As shown in FIG. 1, the PMOS transistor 510 of the bias circuit 400 and the PMOS transistor 508 of the second pre-charge circuit 300 compose a current mirror. A current flowing through the PMOS transistor 508 can be controlled by various configurations of a current mirror circuit. For example, as shown in FIGS. 4A and 4B, which are circuit diagrams illustrating other embodiments of the bias circuit 400 of FIG. 1, a circuit for adjusting a current ratio may be employed to the output node NO. The bias circuit 400 of FIG. 4A has an adjusting circuit 410 that uses a fuse option, and the bias circuit 400 of FIG. 4B has an adjusting circuit 410 that uses switch control signals C1–Cn.

Figure 2:
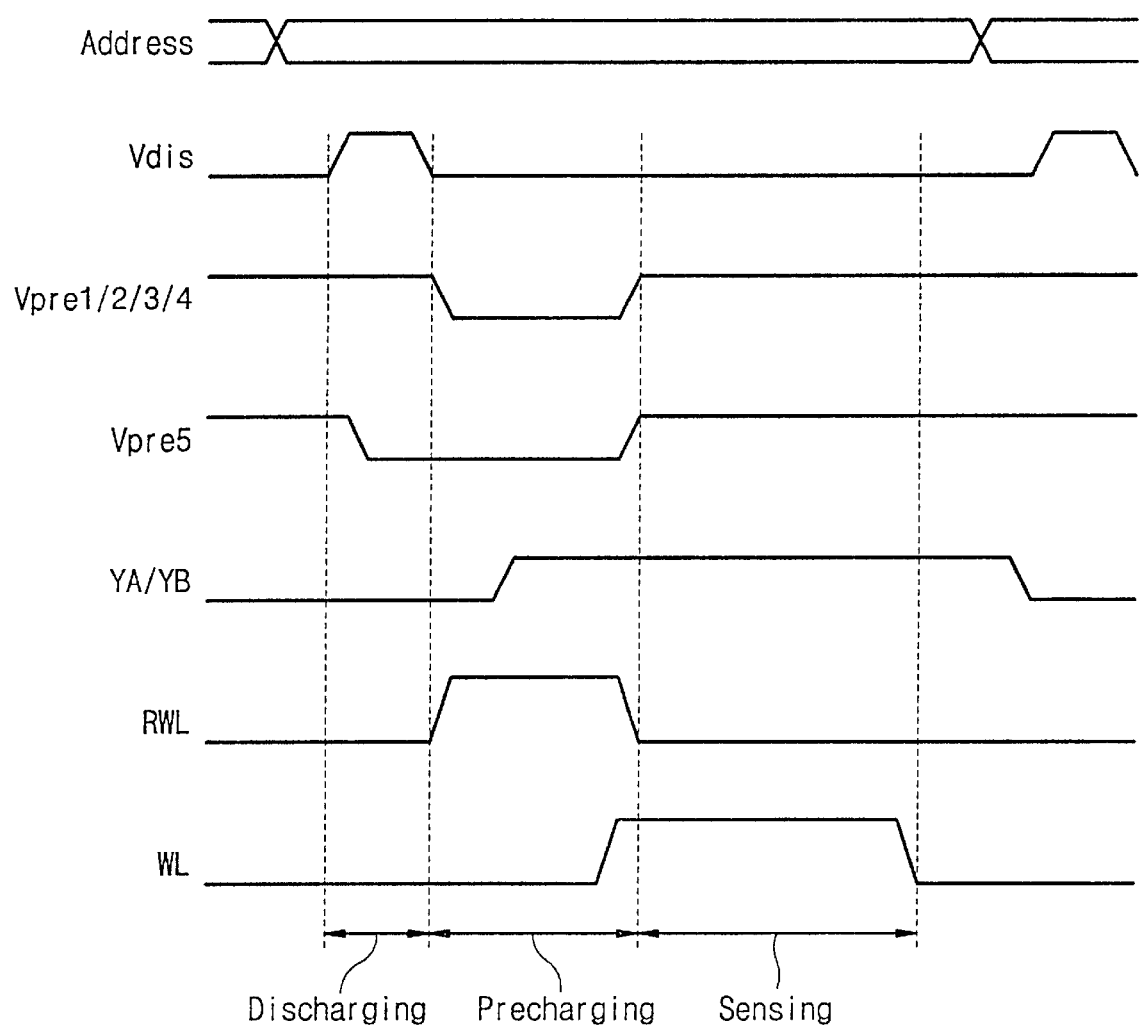
FIG. 2 is a timing diagram illustrating an operation of the sense amplifier circuit of FIG. 1.
Figure 3:
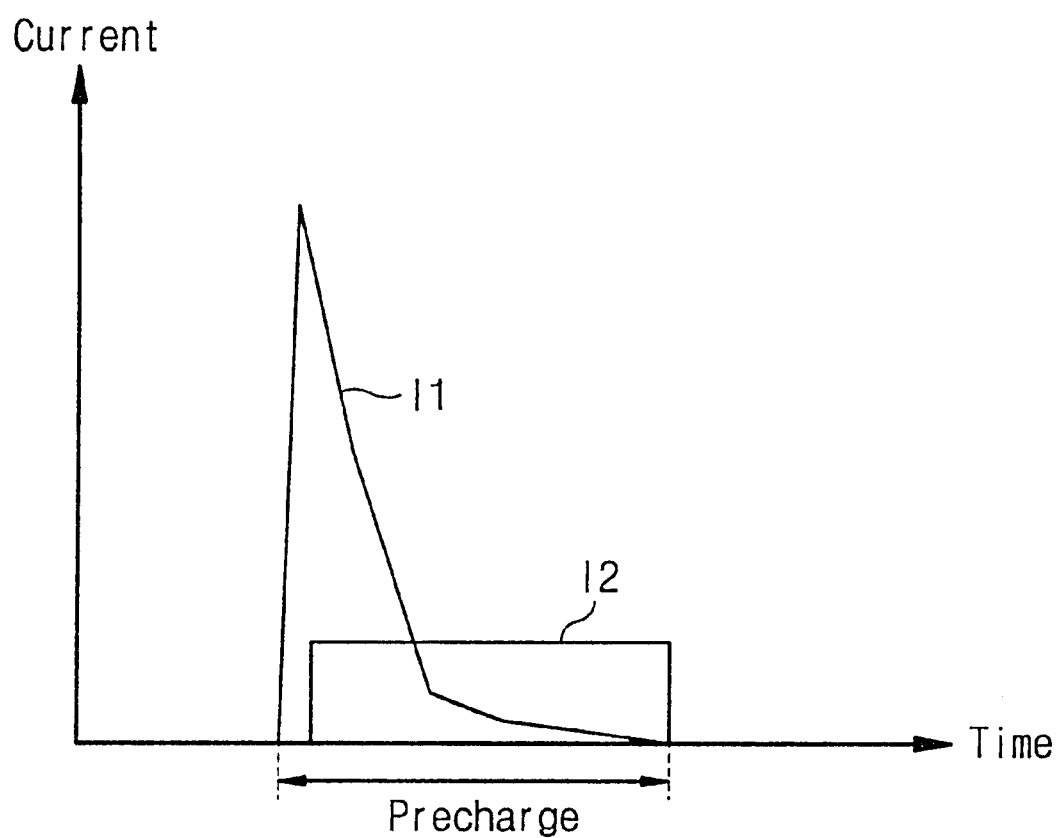
FIG. 3 is a graph illustrating pre-charge characteristics in accordance with the present invention.

FIG. 2 is a timing diagram illustrating an operation of the sense amplifier circuit of FIG. 1, according to an illustrative embodiment of the present invention. FIG. 3 is a graph illustrating pre-charge characteristics in accordance with an illustrative embodiment of the present invention. Referring now to FIGS. 2 to 3, an operation of the sense amplifier circuit according to the present invention will be described below.

First, when an address is changed so as to select a memory cell(s), row address decoding signals YA and YB are activated to high, and then NMOS transistors 515 and 516 that compose a decoding circuit are turned on. The bit line BL and the data line DL are electrically connected with each other through the NMOS transistors 515 and 516 when the NMOS transistors 515 and 516 are turned on. As shown in FIG. 2, before the bit line BL and the data line DL are electrically connected with each other, a voltage of the data line DL is discharged. Namely, the control signal Vdis for discharging the voltage of the data line DL is activated to the high level during a predetermined time. During an activation period of the Vdis, the voltage of the data line DL is initialized by the NMOS transistor 517, e.g., to lower than 0.5V.

When the discharge for the data line DL is finished, the pre-charge control signals Vpre1–Vpre4 are all activated to the low level, and then the reference word line RWL is activated to the high level. As shown in FIG. 2, the pre-charge control signal Vpre5 is activated to the low level when the voltage of the data line DL is discharged or before the pre-charge control signals Vpre1–Vpre4 are activated. When the pre-charge control signals Vpre4 and Vpre5 are activated, the bias circuit 400 provides a constant level bias voltage BIAS2 to a gate of the PMOS transistor 508 in the second pre-charge circuit 300. A current flows from the power supply voltage Vcc toward the data line DL through the PMOS transistor 505 and NMOS transistor 506 in the first pre-charge circuit 200 by the activation of the pre-charge control signals Vpre1–Vpre5. Simultaneously, a current flows from the power supply voltage Vcc toward the data line DL through the PMOS transistors 507 and 508 in the second pre-charge circuit 300. Further, a current also flows from the power supply voltage Vcc toward the data line DL through the PMOS transistor 501 and NMOS transistor 502 in the detecting circuit 100. The voltage of the data line DL starts to increase due to the current supply to the data line DL.

As the voltage of the data line DL gradually goes up to the high level, the output voltage BIAS1 from the inverter 503 starts to attenuate in proportion to the voltage increase of the data line DL. As shown in FIG. 3, a current Ii flowing through the transistors 501 and 502 of the detecting circuit 100 and the transistors 505 and 506 of the first pre-charge circuit 200 is gradually decreased by the attenuation of the output voltage BIAS1 from the inverter 503. In a latter part of the pre-charge period during which the voltage of the data line DL is charged to a predetermined voltage level, e.g., 0.8 V, the current I1 is sharply decreased. In contrast, a current I2 flowing through the PMOS transistors 507 and 508 of the second pre-charge circuit 300 flows constantly regardless of the voltage increase of the data line DL. This is because a voltage difference between the gate voltage BIAS2 of the PMOS transistor 508 provided from the bias circuit 400 and a source voltage (or the data line DL voltage) is constant. When the pre-charge is finished, the pre-charge control signals Vpre1–Vpre5 are inactivated to the high level, and the reference word line RWL is inactivated to the low level.

In a pre-charge period of the data line DL (or bit line BL), a difference between a gate voltage and a drain voltage (or voltage of the data line DL) is reduced, whereby a current provided through the NMOS transistor 506 of the first pre-charge circuit 200 is decreased. However, a constant current flows toward the data line DL because a gate voltage of the PMOS transistor 508 of the second pre-charge circuit 300 is constantly maintained.

Subsequently, when a voltage of the word line WL is increased, the voltage of the data line DL is increased or decreased based upon the state of the memory cell MC, i.e., whether the memory cell MC is in a conducting or non-conducting state. If the memory cell MC is in a conducting state, then a voltage of the sense node SO is decreased because the voltage of the data line DL is lower than the previous pre-charged voltage. The attenuated voltage of the sense node SO is converted into a digital signal (or is detected) by the inverter 504. Conversely, if the memory cell MC is in a non-conducting state, the current does not flow through the memory cell MC. The current continuously flows to the data line DL and the sense node SO through the PMOS transistor 501 and, thereby, the voltage of the sense node SO is increased. The increased voltage of the sense node SO is converted into a digital signal (or is detected) by the inverter 504.

In the sense amplifier circuit of the illustrative embodiment of the present invention described herein, the pre-charge control signals Vpre1–Vpre4 are activated or inactivated at the same time. However, it should be understood that the pre-charge control signals Vpre1–Vpre4 can be activated or inactivated at various points of time. For example, the activation or inactivation of the second pre-charge control signal Vpre2 may be earlier or later than that of the third pre-charge control signal Vpre3. The bias circuit 400 for generating the bias voltage BIAS2 provided to the gate of the PMOS transistor 508 of the second pre-charge circuit can be embodied by employing a circuit generating a constant voltage, e.g., a band gap reference circuit.

Advantageously, the sense amplifier circuit can reduce the pre-charge time for the data line (or bit line electrically connected to the data line) by providing a constant voltage to the data line regardless of fluctuations (or increases) of the data line voltage during the pre-charge period.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. In a flash memory circuit having a plurality of electrically erasable or programmable memory cells and a decoding circuit for electrically connecting a bit line corresponding to a selected memory cell to a data line, a sense amplifier circuit for detecting an on/off state of said selected memory cell by sensing a voltage fluctuation of said bit line, the sense amplifier comprising:

a bias circuit for generating a constant bias voltage during a pre-charge period;

a first pre-charge circuit for providing a variable current to said data line, the variable current changing with a voltage fluctuation of said data line; and a detecting circuit connected to said data line for sensing the voltage fluctuation of said bit line during a sensing period, and for generating data signals corresponding to the on/off state of said selected memory cell.

2. The sense amplifier circuit of claim 1, further comprising a second pre-charge circuit for providing a constant current to said data line, the constant current being determined by said constant bias voltage regardless of the voltage fluctuation of said data line.

3. The sense amplifier circuit of claim 2, wherein said detecting circuit comprises:

a first transistor connected between a first supply voltage and a sense node, and controlled by a first pre-charge control signal;

a first inverting amplifier connected to said data line for generating a predetermined first bias voltage in accordance with a voltage of said data line;

a second transistor connected between said sense node and said data line, and controlled by the predetermined first bias voltage generated from said first inverting amplifier; and an inverter connected to said sense node for generating the data signals corresponding to the on/off state of said selected memory cell.

4. The sense amplifier circuit of claim 3, wherein said first pre-charge circuit comprises third and fourth transistors connected in series between said first supply voltage and said data line, said third transistor being controlled by a second pre-charge control signal, and said fourth transistor being controlled by said predetermined first bias voltage generated from said first inverting amplifier.

5. The sense amplifier circuit of claim 4, wherein said second pre-charge circuit comprises fifth and sixth transistors connected in series between said first supply voltage and said data line, said fifth transistor being controlled by a third pre-charge control signal, and said sixth transistor being controlled by the constant bias voltage generated from said bias circuit.

6. The sense amplifier circuit of claim 5, wherein said bias circuit comprises:

an output terminal for generating the constant bias voltage;

seventh and eighth transistors connected in series between said first supply voltage and said output terminal;

an electrically programmable cell transistor connected between a second supply voltage and a dummy bit line;

a second inverting amplifier connected to said dummy bit line for generating a predetermined second bias voltage in accordance with said dummy bit line;

ninth and tenth transistors connected in series between said first supply voltage and said output terminal; and an eleventh transistor connected between said output terminal and said dummy bit line;

wherein said seventh transistor is controlled by a fourth pre-charge control signal, said eighth transistor is controlled by a voltage of said output terminal, said ninth transistor is controlled by a fifth pre-charge control signal, and said tenth and eleventh transistors are controlled by the second bias voltage generated from said second inverting amplifier.

7. The sense amplifier circuit of claim 6, wherein said sixth transistor of the first pre-charge circuit and said eighth transistor of the bias circuit compose a current mirror.

8. The sense amplifier circuit of claim 7, wherein said bias circuit includes a circuit for adjusting a current ratio of said sixth transistor with respect to said eighth transistor.

9. The sense amplifier circuit of claim 6, wherein said first to fourth pre-charge control signals are simultaneously activated or inactivated during said pre-charge period.

10. The sense amplifier circuit of claim 6, wherein said first to fourth pre-charge control signals are activated or inactivated at various points in time.

11. The sense amplifier circuit of claim 6, wherein said first, third, and fifth to ninth transistors are formed of PMOS transistors, and said second, fourth, tenth, and eleventh transistors are formed of NMOS transistors.

12. The sense amplifier circuit of claim 2, comprising:

a discharge circuit for discharging the voltage of said data line in response to a discharge control signal activated during a discharge period.

13. In a flash memory circuit having a plurality of electrically erasable or programmable memory cells and a decoding circuit for electrically connecting a bit line corresponding to a selected memory cell to a data line, a sense amplifier circuit comprising:

a bias circuit for generating a constant bias voltage during a pre-charge period;

a first pre-charge circuit for providing a variable current to said data line during the pre-charge period, the variable current changing with a voltage fluctuation of said data line;

a second pre-charge circuit for providing a constant current to said data line during the pre-charge period, the constant current being determined by said constant bias voltage irrespective of the voltage fluctuation of said data line; and a detecting circuit connected to said data line for sensing a voltage fluctuation of said bit line during a sensing period, and for generating data signals corresponding to an on/off state of said selected memory cell.

14. The sense amplifier circuit of claim 13, wherein said detecting circuit comprises:

a first transistor connected between a first supply voltage and a sense node, and controlled by a first pre-charge control signal;

a first inverting amplifier connected to said data line for generating a predetermined first bias voltage in accordance with a voltage of said data line;

a second transistor connected between said sense node and said data line, and controlled by the predetermined first bias voltage generated from said first inverting amplifier; and an inverter connected to said sense node for generating the data signals corresponding to the on/off state of said selected memory cell.

15. The sense amplifier circuit of claim 14, wherein said first pre-charge circuit comprises third and fourth transistors connected in series between said first supply voltage and said data line, said third transistor being controlled by a second pre-charge control signal, and said fourth transistor being controlled by said predetermined first bias voltage generated from said first inverting amplifier.

16. The sense amplifier circuit of claim 15, wherein said second pre-charge circuit comprises fifth and sixth transistors connected in series between said first supply voltage and said data line, said fifth transistor being controlled by a third pre-charge control signal, and said sixth transistor being controlled by the constant bias voltage generated from said bias circuit.

17. The sense amplifier circuit of claim 16, wherein said bias circuit comprises:

an output terminal for generating the constant bias voltage;

seventh and eighth transistors connected in series between said first supply voltage and said output terminal;

an electrically programmable cell transistor connected between a second supply voltage and a dummy bit line;

a second inverting amplifier connected to said dummy bit line for generating a predetermined second bias voltage in accordance with said dummy bit line;

ninth and tenth transistors connected in series between said first supply voltage and said output terminal; and an eleventh transistor connected between said output terminal and said dummy bit line;

wherein said seventh transistors is controlled by a fourth pre-charge control signal, said eighth transistor is controlled by a voltage of said output terminal, said ninth transistor is controlled by a fifth pre-charge control signal, and said tenth and eleventh transistors are controlled by the second bias voltage generated from said second inverting amplifier.

18. The sense amplifier circuit of claim 17, wherein said sixth transistor of the first pre-charge circuit and said eighth transistor of the bias circuit compose a current mirror.

19. The sense amplifier circuit of claim 17, wherein said first to fourth pre-charge control signals are simultaneously activated or inactivated during said pre-charge period.

20. The sense amplifier circuit of claim 17, wherein said first to fourth pre-charge control signals are activated or inactivated at various points in time.

* * * * *